US007292381B1

(12) United States Patent
Patterson et al.

(10) Patent No.: US 7,292,381 B1
(45) Date of Patent: Nov. 6, 2007

(54) METHOD FOR CONFORMING A MICRO-ELECTRONIC ARRAY TO ARBITRARY SHAPES

(75) Inventors: Pamela Patterson, Los Angeles, CA (US); Andy Hunter, Woodland Hills, CA (US); Angela Shum, Arcadia, CA (US); Peter David Brewer, Westlake Village, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 11/223,872

(22) Filed: Sep. 8, 2005

(51) Int. Cl.
*G02F 1/03* (2006.01)
*H01L 23/34* (2006.01)

(52) U.S. Cl. ..................... 359/248; 257/723
(58) Field of Classification Search ............... 438/758, 438/759; 430/270.14, 311, 312; 257/723; 437/2; 250/332; 345/8; 359/248
See application file for complete search history.

(56) References Cited

U.S. PATENT DOCUMENTS 6,455,931 B1 * 9/2002 Hamilton et al. ........... 257/723

6,566,276 B2 * 5/2003 Maloney et al. ............ 438/758

* cited by examiner

Primary Examiner—Ricky Mack
Assistant Examiner—Jack Dinh
(74) Attorney, Agent, or Firm—Tope-McKay

(57) ABSTRACT

Described is a method for conforming electronics to arbitrary shapes. The method comprises acts of forming a device structure to have a growth substrate, an etch stop layer affixed with the growth substrate, and a micro-electronic array. The micro-electronic array comprises a plurality of components atop the etch stop layer. The micro-electronic array is thereafter embedded into a shrinkable layer. The shrinkable layer is then mounted onto a handle wafer that includes a layer of adhering film with the shrinkable layer being pressed into the layer of adhering film. The growth substrate and the etch stop layer are thereafter removed. The adhering film is then dissolved to demount the micro-electronic array and shrinkable layer. Finally, the shrinkable layer is shrunk to conform the micro-electronic array to a three-dimensional shape, with the growth orientation flipped such that metal interconnects may be made to both the top and bottom of the chip.

37 Claims, 5 Drawing Sheets

METHOD FOR CONFORMING A MICRO-ELECTRONIC ARRAY TO ARBITRARY SHAPES

BACKGROUND OF THE INVENTION (1) Field of Invention

The present invention relates to microelectronic array formation, and more particularly, to a method for forming a microelectronic array that can conform its shape to an arbitrary three-dimensional shape.

(2) Description of Related Art

Electronics and/or semiconductors are typically formed as flat wafers. In some circumstances, it may be desirable to form a semiconductor as a curved structure. However, current semiconductor technology is limited in its ability to form curved structures containing high densities of active components. There are known techniques that employ simple bending procedures of a thinned crystalline material, or segmenting the structure into sub-arrays to allow for curving of the arrays. By way of example, Dr. James Gregory of the Massachusetts Institute of Technology (MIT) Lincoln Laboratory (LL), used a bending procedure to bend thin charge coupled device (CCD) arrays (details given below). MIT's Lincoln Laboratory is located at 244 Wood Street, Lexington, Mass., 02420-9108, United States of America (U.S.A.).

Dr. James Gregory has demonstrated the basic technology for deforming thinned CCD arrays into cylindrical and spherical focal planes. In his work, an integrated circuit on a curved surface is produced from a circuit on a planar wafer by thinning the substrate wafer and deforming the thinned membrane into a curved shape.

LL has fabricated, thinned, and deformed CCDs, and evaluated the CCDs for electrical and optical performance. In his work, Dr. Gregory discussed the benefits of curved focal surfaces, which occur naturally in many lens systems. A benefit identified by Dr. Gregory is that the optical performance can be improved while eliminating corrective elements to reduce system complexity. LL has fabricated and tested a CCD petal chip that can be wrapped around a spherical section. LL also explored creating a Si mesh with conductive elements and deforming this mesh and populating it with discrete optical detectors.

Spherical curvature of semiconductor devices on a Kapton film has been demonstrated by a group at Princeton University (P. I. Hsu, R. Bhattacharya, H. Gleskova, M. Huang, Z. Xi, Z. Suo, S. Wagner, and J. C. Sturma, Applied Physics Letters, 81, 1723 (2002)). Princeton University is located at Princeton, N.J. 08544, U.S.A. Thin film transistors on a 6 centimeter (2.36 inches) diameter Kapton film were deformed using a pressurized gas. The Princeton group reported a limited curvature of one steradian (~7% of a sphere's surface area). While a curvature occurred, one steradian is insufficient if attempting to conform the semiconductor device to a sphere.

Additionally, U.S. Pat. No. 6,455,931, issued to Hamilton, Jr. et al. (hereinafter "the Hamilton patent"), discloses a micro-electronic array structure having substrate islands. The Hamilton patent discloses forming a thinned material between the islands, so that the micro-electronic array structure can be bent around a curved object.

In the prior art discussed above, the methods for covering arbitrary shapes with a semiconductor material typically involve stretching a flexible film. A problem associated with stretching flexible film is that electrical resistance degradation occurs between the metals used to interconnect the discrete devices. In approaches involving stretching of the material, the interconnects are pulled in tension and the resistance increases rapidly. Metal in tension is also more likely to fail from cracking.

The approaches described above are limited in the variety of shapes that can be conformed to and their general applicability to a wide set of device or sensor technologies. Additionally, the prior art relies on deforming the active device itself, which requires thinning the initially rigid material for curvature to be accomplished. Bending or deforming the active components can introduce serious performance degradation by increasing the resistance between the metal interconnects.

Thus, a continuing need exists for a technique to conform a micro-electronic array to arbitrary shapes that allows for a high degree of curvature or surface coverage, and that does not cause performance degradation.

SUMMARY OF INVENTION

Dr. Patterson, this section will be completed upon approval of the claims, as this section mirrors the claims.

BRIEF DESCRIPTION OF THE DRAWINGS

The objects, features and advantages of the present invention will be apparent from the following detailed descriptions of the various aspects of the invention in conjunction with reference to the following drawings, where.

DETAILED DESCRIPTION

Figure 1:
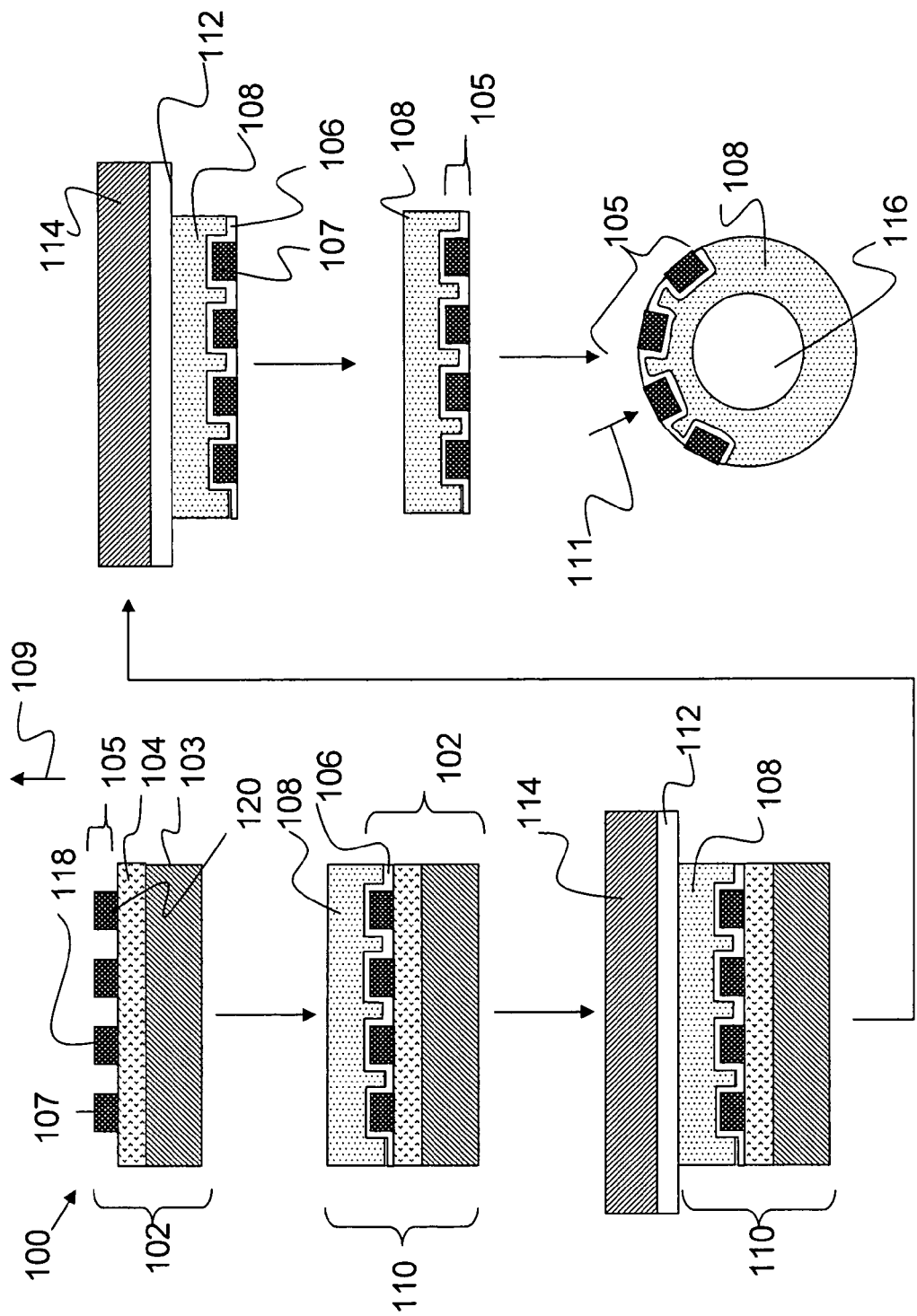
FIG. 1 illustrates a process flow diagram depicting steps for applying discrete devices to a three-dimensional (3D) shape.

The present invention relates to micro-electronic array formation, and more particularly, to a method for forming a micro-electronic array that can conform its shape to an arbitrary three-dimensional shape. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Before describing the invention in detail, first an introduction is provided to provide the reader with a general understanding of the present invention. Finally, a description of various aspects of the present invention is provided to give an understanding of the specific details.

(1) Introduction

The present invention describes a method for applying rigid materials, including integrated circuits fabricated on planar rigid semiconductor materials, to a flexible plastic material for the purpose of applying discrete devices to complex geometric shapes. Non-limiting examples of such shapes include spherically symmetric structures. For example, flexible polyolefin plastic (i.e., shrink-wrap) enables the application of discrete devices to three dimensional objects of arbitrary shape since the shrink-wrap conforms to near arbitrary shapes with the application of heat. The multi-step method provides a technique for creating electronic circuits on complex three-dimensional (3D) objects by: 1) defining spatially discrete array elements of diverse materials though selective etching techniques; 2) transferring the initially planar array of chips consisting of integrated circuits or discrete devices to a flexible plastic; 3) removing the rigid substrate employing an etch stop layer between the substrate and the active layer or device layer; and 4) applying the flexible semiconductor-plastic assembly to the desired 3D host structure.

An unique improvement provided by the present invention is that shrinking a material (i.e., shrink-wrap) enables a larger deformation without electrical resistance degradation (as in the prior art) of the metals used to interconnect the discrete devices. In this aspect, the metal is folded in compression as opposed to being stretched. The present invention is to be contrasted with the prior art (as discussed above), where methods for covering arbitrary shapes with a semiconductor material typically involve stretching a flexible film. A problem associated with stretching a flexible film is that electrical resistance degradation occurs between the metals used to interconnect the discrete devices. In approaches involving stretching of the material, the interconnects are pulled in tension and the resistance increases rapidly. Metal in tension is also more likely to fail from cracking. Shrinking the film also provides a method for attaining a high fill factor with discrete devices as opposed to the prior art's stretching which increases the fill factor. The degree of curvature or surface coverage that can be obtained through the method described herein is much higher than previous demonstrations. In principle there is no limitation which would preclude covering an entire spherical surface with the approach of the present invention.

The present invention overcomes limitations of the prior art by separating the electronic or sensor components from their growth substrate and embedding or attaching them into or on a deformable material. This enables the shaping process in effect to use the smallest possible sub-arrays and any curvature problem is transferred to the polymer medium. The shaping process in the present invention can range from simple bending for producing cylindrical shapes, to 3D deformation for hemispherical or more complex shapes. The 3D deformation process employs shrinking of the polymer material between the array components. The method described herein enables a number of innovative benefits for fabricating curved systems including:

a. Virtually any device technology and/or materials family can be employed using this approach;

b. The components can range from individual devices or sensor elements to arrays of components to complete integrated circuits (ICs);

c. During the fabrication process, access to both the top-side and bottom-side enables electrical interconnects between components;

d. Fabrication of simple and complex shaping of a semiconductor-plastic assembly is allowed by bending, segmenting, or deforming the plastic to a support structure; and e. The fill factor of the discrete semiconductor elements may be tailored by controlling the conditions of the polymer shrink process.

As can be appreciated by one in the art, the technique described herein can be used to apply a wide variety of micro-electronics to virtually any arbitrary shape. Following is a detailed description of the method for conforming a micro-electronic array to arbitrary shapes according to the present invention.

(2) Description

The present invention relates to a method for conforming a micro-electronic array to arbitrary shapes according to the present invention. A novel aspect of the present invention is the use of an innovative embedding and array transfer technology that allows the fabrication of structures with complex curvature from planar arrays. The approach described herein utilizes wafer-scale methods for transferring delineated device arrays from their original growth substrate to a deformable plastic material which is then applied to an arbitrarily-shaped (e.g., spherical) support structure.

As shown schematically in FIG. 1, the fabrication method 100 includes the following steps: (1) forming discrete devices 102 having a growth substrate 103, an etch stop layer 104, and a micro-electronic array 105; (2) embedding arrays of the pre-fabricated and interconnected devices 102 into an epoxy coated 106 shrinkable layer 108 (e.g., shrink-wrap) to create an embedded array 110; (3) mounting the embedded array 110 to an adhering film 112—coated handle wafer 114; (4) selectively removing the growth substrate 103; (5) removing the shrinkable layer 108 with embedded micro-electronic array 105 from the handle wafer 114; and (5) shaping the shrinkable layer 108 to a three-dimensional (3D) support structure 116. In the sequence of steps shown in FIG. 1, the individual components 105 of the micro-electronic array 105, once transferred, are "upside down" compared to their normal orientation on the growth substrate 103. To provide access to the micro-electronic array 105 contacts after the components 105 are embedded and turned upside down, the contacts from the normal top-side 118 of the components 105 may be routed to the growth substrate 103 surface. This enables the components 105 of the micro-electronic array 105 to be interconnected from both the top-side 118 and bottom-side 120 and provides electrical access to the components 105 after transfer.

Non-limiting examples of components suitable for the fabrication sequence described herein include devices created at the wafer level with planar micro-fabrication techniques (e.g., high electron mobility transistors (HEMTs), heterojunction bipolar transistors (HBTs), resonant tunneling diodes (RTDs), sensors, modulators, silicon integrated circuits on silicon on insulator (SOI), etc.).

(2.1) Further Details of Each Step of the Fabrication Method According to the Present Invention are Described in the Following Section.

Step 1: Component Formation

Figure 3A:
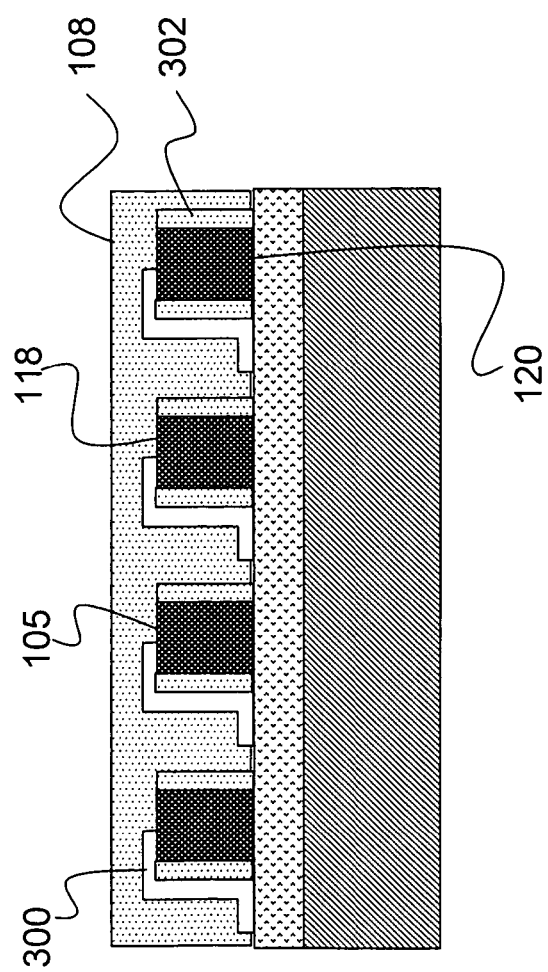
FIG. 3A is an illustration of top-side metals being connected as interconnects on the micro-electronic array components.

In the first step, arrays of device structures 102 are formed using formation techniques to have a growth substrate 103, an etch stop layer 104, and a micro-electronic array 105, with the micro-electronic array 105 having an original planar growth orientation 109. Non-limiting examples of such techniques include dry or wet etching procedures (preferably with an etch stop layer 104) and photolithographic techniques. The micro-electronic array components 105 at this step may be interconnected using top-side 118 metallization (described in further detail below regarding FIG. 3A). It is important that the top-side 118 metals are accessible from the bottom-side 120 once the growth substrate 103 is removed. The device structures 102 may also be intentionally under cut with respect to the growth substrate 103 in the formation procedure (i.e., Step 1) so that in the following step (i.e., Step 2), the shrinkable layer 108 (e.g., polymer layer) covers the edges of the micro-electronic array components 105. This procedure provides a barb on the components 105 for the shrinkable layer 108 to latch onto and holding them more securely, once released from the growth substrate 103.

Step 2: Embedding Arrays into the Shrinkable Layer

Step 2 of FIG. 1 illustrates embedding the arrays of pre-fabricated and interconnected devices 102 into an epoxy coated 106 shrinkable layer 108 to form an embedded array 110. The shrinkable layer 108 is any suitable non-conductive film-like material having shrinkable properties, a non-limiting example of which includes shrink wrap such as Cryovac® Shrink Film, and more specifically, Cryovac® D-940. Cryovac® Shrink Film is produced by the Sealed Air Corporation, located at Park 80 East, Saddle Brook, N.J. 07663 U.S.A. As can be appreciated by one in the art, there are numerous techniques for forming and embedding the device 102 into the shrinkable layer 108. As a non-limiting example, to secure the micro-electronic array components 105 (e.g., chips) to the shrinkable layer 108, an ultra-thin (~1500 Å) spin-on epoxy 106 has been utilized. The epoxy 106 is spun on the shrinkable layer 108 held taught by a 5 inch diameter snap ring holder. The shrinkable layer 108 requires exposure to an oxygen plasma for the spin-on epoxy to wet the surface. For example, a hot embossing wafer system can be used that provides controlled temperature, pressure, and vacuum conditions. The process is sufficiently robust to allow high adhesion yield for components as small as 45 µm. Complete embedding of 5 µm silicon mesa structures (i.e., micro-electronic array components) in Cryovac® D-940 shrink wrap was obtained at 120° C. with 8000N of pressure applied for 20 minutes.

Step 3: Mounting the Embedded Arrays to a Holder

In order to remove the growth substrate 103, the wafer must be mounted to a carrier or holder. The shrinkable layer 108 is pressed into an adhering film 112 applied to the handle wafer 114. The adhering film 112 is an adhesive layer to prevent the handle wafer 114 from separating from the shrinkable layer 108, a non-limiting example of which includes a low temperature wax (mp 70° C.).

In some cases, especially those where the device layer (i.e., layers remaining after substrate removal) exhibits high stress, very good adhesion is desired to prevent the shrinkable layer 108 from buckling away from the handle wafer 114 once the growth substrate 103 is removed. This is particularly important if photolithography of the bottom-side 120 is needed, such as required to add interconnects. The same epoxy used to adhere the micro-electronic array components 105 to the shrinkable layer 108 may be used as the adhering film 112 if an appropriate release layer is applied to the handle wafer 114 first. It has been demonstrated that a plastic film can be released using this technique with MICROCHEM OmniCoat as the release layer. Omni-Coat is produced by MICROCHEM, located at 1254 Chestnut Street, Newton, Mass., 02464, U.S.A. It was also found that the epoxy adhering film 112 results in a much smoother film than the wax adhering film 112, with all other factors being equal.

Step 4: Growth Substrate Removal

Removal of growth substrate 103 can be accomplished in several ways. Non-limiting examples of which include lapping (grinding) to remove the bulk of the growth substrate 103 (from ~500 µm to 100 µm), chemical-mechanical-polishing (from ~100 µm to 30 µm), and selective wet or dry etching of the growth substrate 103 (1–10 µm).

Ideally, an etch stop layer 104 is fabricated under the growth substrate 103 to enhance the etch selectivity for removing the growth substrate 103 from device 102 layers. As a non-limiting example, for silicon on insulator (SOI), the buried oxide provides ~200:1 etch selectivity in deep reactive ion etching (DRIE). After removal of the growth substrate 103, the etch stop layer 104 is removed by wet or dry selective etching.

In some circumstances, it may be desirable to include bottom-side 120 metals to the micro-electronic array components 105. After having removed the growth substrate 103, the bottom-side 120 of the components 105 will be exposed, allowing for bottom-side 120 metallization (as described in further detail below regarding FIG. 3B).

Step 5: Demounting the Embedded Array

To remove the embedded array 110, the adhering film 112 (i.e., adhesion layer) described above in Step 3, is selectively dissolved and the free standing shrinkable layer 108 is released. Any suitable solvent may be used, so long as all solvents used do not attack either the shrinkable layer 108 or the epoxy layer 106 holding the micro-electronic array components 105 (e.g., chips) to the shrinkable layer 108. As non-limiting examples, for the case of a low temperature wax, trichloroethylene (TCE) or OptiClear may be used. OptiClear is wax removal solvent produced by National Diagnostic, located at 305 Patton Drive, Atlanta, Ga. 30336, U.S.A. For the case of epoxy and MICROCHEM OmniCoat, a solvent such as heated (80° C.) BAKER PRS-1000 photoresist stripper may be used. The BAKER PRS-1000 solvent is produced by Mallinckrodt Baker, Inc., located at 222 Red School Lane, Phillipsburg, N.J. 08865, U.S.A. It was found that the solvents described here are selective to the Cryovac® D-950 shrink film (i.e., shrinkable layer 108) and to the epoxy layer 110.

Step 6: Conforming the Embedded Arrays to a 3D Shape

Figure 2:
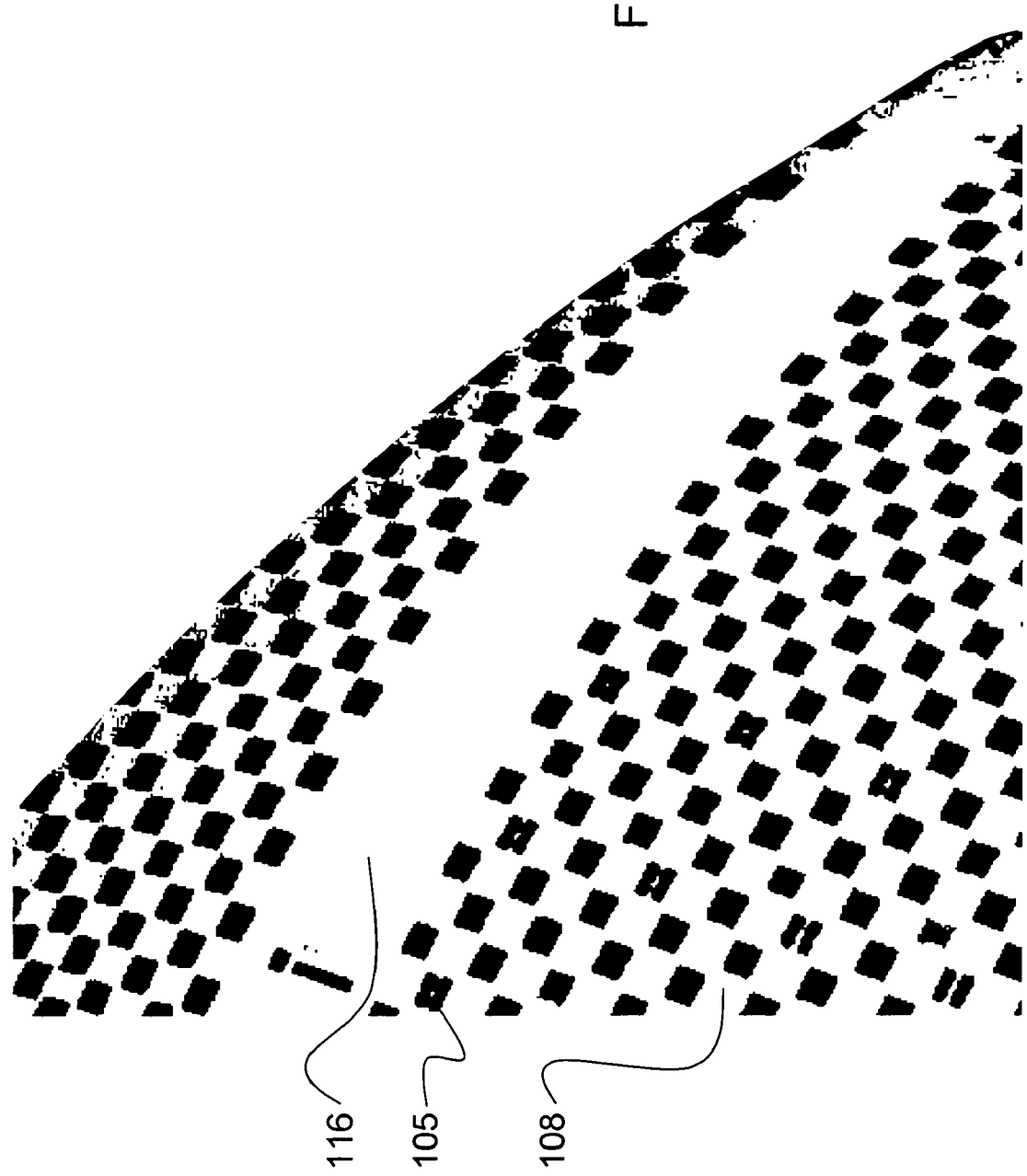
FIG. 2 is an illustration showing micro-electronic array components (e.g., test chips) on a shrinkable layer (e.g., shrink-wrap) having been attached to a sphere.

Before shrinking the shrinkable layer 108, the micro-electronic array 105 and shrinkable layer 108 are positioned upon the 3D object 116 such that the shrinkable layer 108 is in contact with 3D object 116 and the micro-electronic array 105 is upside down 111 as compared to the original planar growth orientation 109, with heat thereafter being applied to the shrinkable layer 108. To apply the shrinkable layer 108 to an object 116 by heat shrinking, the edges of the shrinking plastic (i.e., shrinkable layer 108) must be fixed to balance the tension created. Several techniques are available for fixing the edges of the shrinkable layer 108, a non-limiting example of which includes creating a three sided envelope and hot seaming the edges, placing the object 116 inside, and then hot seaming the remaining edge. Additionally, other approaches may be used to fix the edges such as gluing, taping, or fastening with clamps. The enclosed object 116 is then placed in an oven (or heated through any other suitable technique) and heated to the shrink temperature (specific to the type or make of the shrinkable layer 108). For the non-limiting example shown in FIG. 2, a hot seaming technique was used to apply a silicon array (i.e., micro-electronic array 105) embedded in Cryovac D-940 plastic (i.e., shrinkable layer 108) to half of a one inch diameter alumina sphere (i.e., object 116). As shown in FIG. 2, after the shrinkable layer 108 has been shrunk, the micro-electronic array 105 conforms with the shape of the object 116, which in this example was a sphere.

(2.2) Metallization

As discussed above in Step 1, and as shown in FIG. 3A, the micro-electronic array components 105 may be interconnected with each other or to create contact points using top-side 118 metallization by applying a metal 300 to the top-side of the components 105. In doing so, the micro-electronic array components 105 can be isolated on their side walls by using an insulator 302 such as benzocyclobutene (dow chemical)(BCB). After applying the insulator 302, the metal 300 may be patterned onto the top-side 118 of the components 105, with the components thereafter being embedded into the shrinkable layer 108. Through this process, the top-side 118 metals 300 will be accessible from the bottom-side 120 once the growth substrate 103 is removed.

Figure 3B:
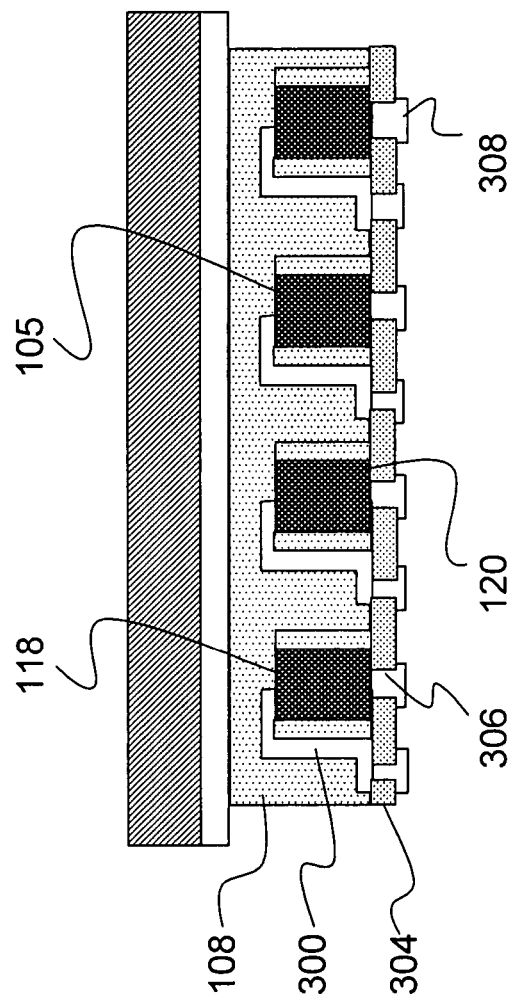
FIG. 3B is an illustration of bottom-side metals being connected as interconnects on the micro-electronic array components.

In some circumstances, it may be desirable to include metals 300 on the bottom-side 120 to also serve as interconnects. As shown in FIG. 3B, after the micro-electronic array components 105 are exposed (in Step 4), an electrically insulating layer 304 (e.g., dielectric film) is added to the bottom-side 120 of the components 105. The insulating layer 304 is then etched to provide vias 306 to the top-side 118 metals 300, thereby allowing access to the top-side 118 interconnects. Additionally, vias 306 are formed in the insulating layer 304 to provide access to the bottom-side 120 of the components 105. Bottom-side 120 metals 300 are then patterned to serve as bottom-side interconnects 308. In some cases such as Silicon-on-Insulator (SOI), the existing etch stop layer (oxide for SOI), may be used instead of adding an insulation layer after etch stop removal.

(2.3) Electrical Resistance Stability

When shrinking an object, particularly if the object includes metal interconnects, a concern arises about changes in the electrical resistance of the metal. However, because the metal length is not changed when shrinking the shrinkable plastic (it simply becomes partially folded), the electrical resistance remains unchanged.

Figure 4A:
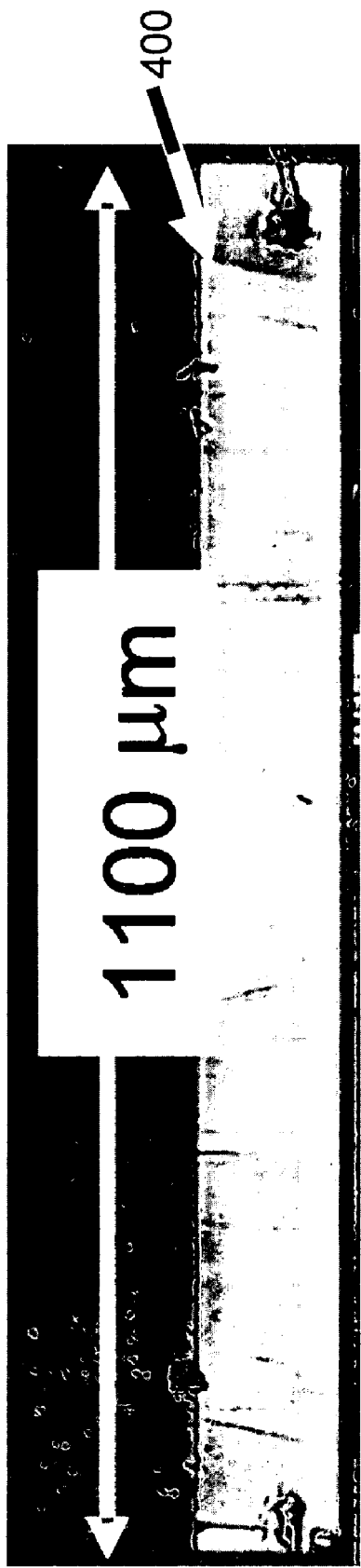
FIG. 4A is a micro-photograph of an interconnect on the shrinkable layer prior to any shrinkage.
Figure 4B:
FIG. 4B is a micro-photograph of an interconnect on the shrinkable layer, showing a 20% compressive deformation.

For further illustration and as shown in FIG. 4, a free-standing plastic film with metal (1 µm thick Au) patterns 400 was prepared. The plastic-metal film was applied to a glass slide by shrinking the film to form a shrunken plastic-metal film 402. After having been shrunken, the folding of metal lines 404 ranged from none to ~20%, as shown.

Figure 5:
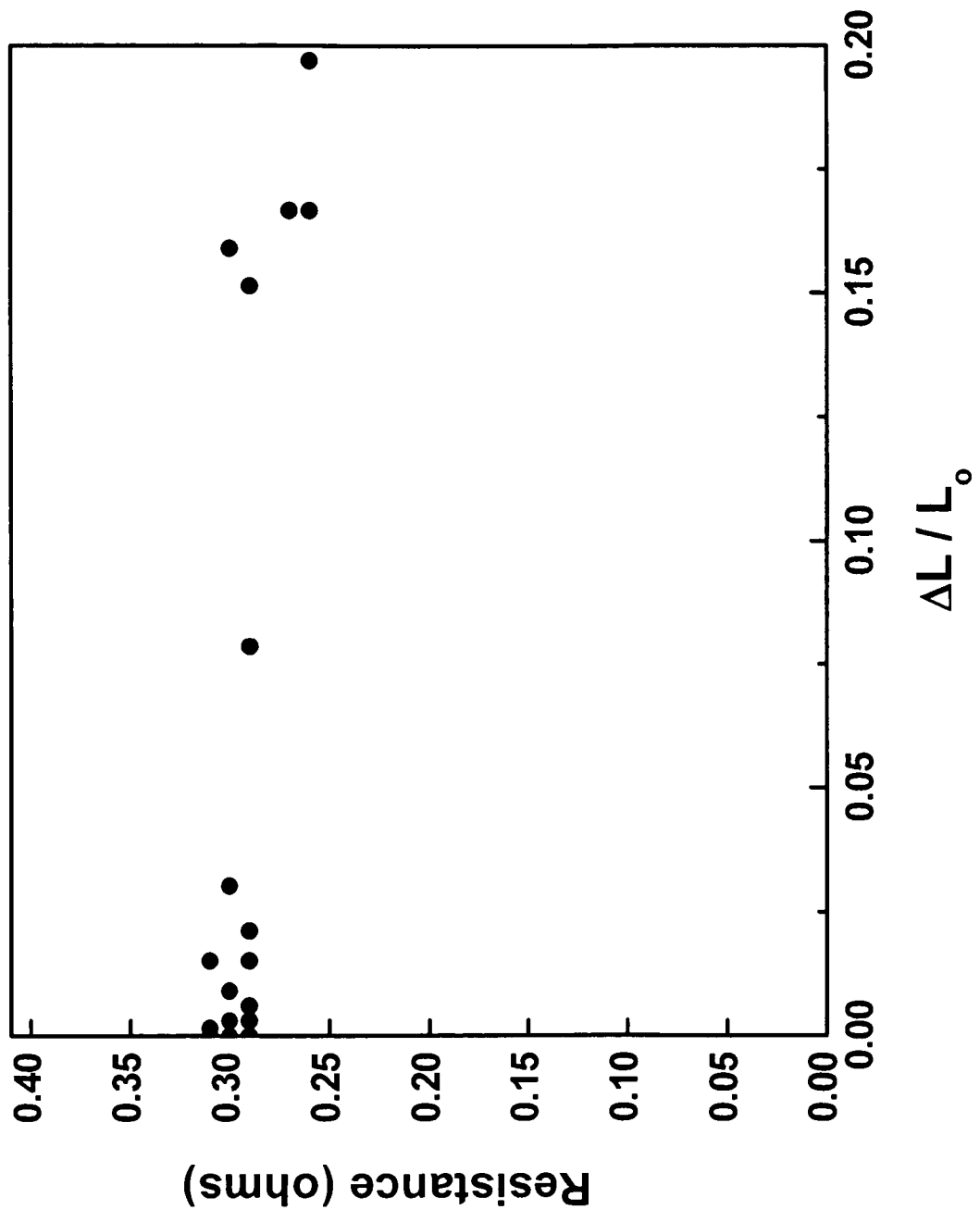
FIG. 5 is a plot-chart illustrating a measured resistance of gold lines on the shrinkable layer as a function of the change in length through shrinkage, showing essentially no change in resistance over a range of 0–20% change.

After having shrunken the shrinkable plastic, electrical resistance of the metal was measured and plotted. A plot of the resistance versus change in length is shown in FIG. 5. It was found that with a 20% compressive change, there was no change in resistance, indicating the feasibility of adding interconnects to chips on the shrink-wrap film.

What is claimed is:

1. A method for conforming a micro-electronic array to an arbitrary shape, comprising acts of:

forming a device structure to have a growth substrate, an etch stop layer affixed with the growth substrate, and a micro-electronic array comprising a plurality of components atop the etch stop layer and having an original planar growth orientation;

embedding the micro-electronic array into a shrinkable layer such that the micro-electronic array is embedded within the shrinkable layer;

mounting the shrinkable layer onto a handle wafer, the handle wafer including a layer of adhering film with the shrinkable layer being pressed into the layer of adhering film;

removing the growth substrate and the etch stop layer;

dissolving the adhering film to demount the micro-electronic array and shrinkable layer;

shrinking the shrinkable layer to conform the micro-electronic array to a three-dimensional shape.

2. A method as set forth in claim 1, wherein in the act of embedding the micro-electronic array into a shrinkable layer, the shrinkable layer is shrink wrap.

3. A method as set forth in claim 2, wherein in the act of forming the device structure, the device structure is formed using a technique selected from a group consisting of dry etching, wet etching, and photolithography.

4. A method as set forth in claim 3, further comprising an act of forming the shrinkable layer by coating a shrink film with a spin-on epoxy, so that the shrinkable layer comprises an epoxy coated shrink film.

5. A method as set forth in claim 4, wherein in the act of mounting the shrinkable layer onto a handle wafer, the layer of adhering film is selected from a group consisting of a wax adhering film and an epoxy adhering film.

6. A method as set forth in claim 5, wherein in the act of removing the growth substrate and the etch stop layer, the growth substrate is removed using a technique selected from a group consisting of lapping, chemical mechanical polishing, selective wet etching, and selective dry etching.

7. A method as set forth in claim 6, wherein in the act of removing the growth substrate and the etch stop layer, the etch stop layer is removed using a technique selected from a group consisting of selective wet etching and selective dry etching.

8. A method as set forth in claim 7, where in the act of dissolving the adhering film, the adhering film is dissolved using a solvent selected from a group consisting of trichloroethylene, OptiClear, and Baker PRS-1000.

9. A method as set forth in claim 8, wherein in the act of shrinking the shrinkable layer to conform the micro-electronic array to a three-dimensional (3D) shape, the micro-electronic array and shrinkable layer are positioned upon the 3D object such that the shrinkable layer is in contact with 3D object and the micro-electronic array is upside down as compared to the original planar growth orientation, with heat thereafter being applied to the shrinkable layer, thereby shrinking the micro-electronic array to conform with the 3D object's shape.

10. A method as set forth in claim 9, wherein the micro-electronic array components have side walls, a top-side, and a bottom-side, and further comprising acts of connecting insulators with the side walls and forming interconnects electrically connected with the micro-electronic array.

11. A method as set forth in claim 10, wherein in the act of forming interconnects, metal is patterned on the top-side of the components using top-side metallization before the act of embedding the micro-electronic array into a shrinkable layer.

12. A method as set forth in claim 11, wherein in the act of forming interconnects, and before the act of dissolving the adhering film, an insulating layer is added to the bottom-side of the components, with the insulating layer thereafter being etched to expose the bottom-side of the components and metal thereafter being patterned to the bottom-side of the components using bottom-side metallization.

13. A method as set forth in claim 11, wherein in the act of forming interconnects, and before the act of dissolving the adhering film, the etch stop layer is etched to expose the bottom-side of the components and metal thereafter being patterned to the bottom-side of the components using bottom-side metallization.

14. A method as set forth in claim 1, wherein in the act of forming the device structure, the device structure is formed using a technique selected from a group consisting of dry etching, wet etching, and photolithography.

15. A method as set forth in claim 1, further comprising an act of forming the shrinkable layer by coating a shrink film with a spin-on epoxy, so that the shrinkable layer comprises an epoxy coated shrink film.

16. A method as set forth in claim 1, wherein in the act of mounting the shrinkable layer onto a handle wafer, the layer of adhering film is selected from a group consisting of a wax adhering film and an epoxy adhering film.

17. A method as set forth in claim 1, wherein in the act of removing the growth substrate and the etch stop layer, the growth substrate is removed using a technique selected from a group consisting of lapping, chemical mechanical polishing, selective wet etching, and selective dry etching.

18. A method as set forth in claim 17, wherein in the act of removing the growth substrate and the etch stop layer, the etch stop layer is removed using a technique selected from a group consisting of selective wet etching and selective dry etching.

19. A method as set forth in claim 1, where in the act of dissolving the adhering film, the adhering film is dissolved using a solvent selected from a group consisting of trichloroethylene, OptiClear, and Baker PRS-1000.

20. A method as set forth in claim 1, wherein in the act of shrinking the shrinkable layer to conform the micro-electronic array to a three-dimensional (3D) shape, the micro-electronic array and shrinkable layer are positioned upon the 3D object such that the shrinkable layer is in contact with 3D object and the micro-electronic array is upside down as compared to the original planar growth orientation, with heat thereafter being applied to the shrinkable layer, thereby shrinking the micro-electronic array to conform with the 3D object's shape.

21. A method as set forth in claim 1, wherein the micro-electronic array components have side walls, a top-side, and a bottom-side, and further comprising acts of connecting insulators with the side walls and forming interconnects electrically connected with the micro-electronic array.

22. A method as set forth in claim 21, wherein in the act of forming interconnects, metal is patterned on the top-side of the components using top-side metallization before the act of embedding the micro-electronic array into a shrinkable layer.

23. A method as set forth in claim 21, wherein in the act of forming interconnects, and before the act of dissolving the adhering film, an insulating layer is added to the bottom-side of the components, with the insulating layer thereafter being etched to expose the bottom-side of the components and metal thereafter being patterned to the bottom-side of the components using bottom-side metallization.

24. A method as set forth in claim 21, wherein in the act of forming interconnects, and before the act of dissolving the adhering film, the etch stop layer is etched to expose the bottom-side of the components and metal thereafter being patterned to the bottom-side of the components using bottom-side metallization.

25. An arbitrarily shaped micro-electronic array, formed by the method of claim 1.

26. An arbitrarily shaped micro-electronic array, formed by the method of claim 2.

27. An arbitrarily shaped micro-electronic array, formed by the method of claim 3.

28. An arbitrarily shaped micro-electronic array, formed by the method of claim 4.

29. An arbitrarily shaped micro-electronic array, formed by the method of claim 5.

30. An arbitrarily shaped micro-electronic array, formed by the method of claim 6.

31. An arbitrarily shaped micro-electronic array, formed by the method of claim 7.

32. An arbitrarily shaped micro-electronic array, formed by the method of claim 8.

33. An arbitrarily shaped micro-electronic array, formed by the method of claim 9.

34. An arbitrarily shaped micro-electronic array, formed by the method of claim 10.

35. An arbitrarily shaped micro-electronic array, formed by the method of claim 11.

36. An arbitrarily shaped micro-electronic array, formed by the method of claim 12.

37. An arbitrarily shaped micro-electronic array, formed by the method of claim 13.

* * * * *